United States Patent
Wasshuber et al.

(10) Patent No.: US 7,122,413 B2
(45) Date of Patent: Oct. 17, 2006

(54) METHOD TO MANUFACTURE SILICON QUANTUM ISLANDS AND SINGLE-ELECTRON DEVICES

(75) Inventors: Christoph Wasshuber, Parker, TX (US); Gabriel George Barna, Dallas, TX (US); Olivier Alain Faynot, Seyssinet (FR)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/741,489

(22) Filed: Dec. 19, 2003

(65) Prior Publication Data

US 2005/0136655 A1 Jun. 23, 2005

(51) Int. Cl.
*H01L 21/336* (2006.01)

(52) U.S. Cl. .......................... 438/198; 257/9

(58) Field of Classification Search ........ 438/197–198, 438/263–264, 288, 509, 962; 257/9, 20, 257/24, 30, 321, 369, E29.17, E29.309, E21.209
See application file for complete search history.

(56) References Cited

U.S. PATENT DOCUMENTS

| | | | | |
|---|---|---|---|---|
| 4,788,160 A | * | 11/1988 | Havemann et al. | 438/305 |
| 5,731,598 A | * | 3/1998 | Kado et al. | 257/30 |
| 6,297,095 B1 | * | 10/2001 | Muralidhar et al. | 438/257 |
| 6,444,545 B1 | * | 9/2002 | Sadd et al. | 438/503 |
| 6,524,883 B1 | | 2/2003 | Kim | |

* cited by examiner

*Primary Examiner*—David Vu
(74) *Attorney, Agent, or Firm*—Peter K. McLarty; W. James Brady, III; Frederick J. Telecky, Jr.

(57) ABSTRACT

The present invention provides a method of manufacturing a single-electron transistor device (100). The method includes forming a thinned region (110) in a silicon substrate (105), the thinned region (110) offset by a non-selected region (115). The method also includes forming at least one quantum island (145) from the thinned region (110) by subjecting the thinned region (110) to an annealing process. The non-selected region (115) is aligned with the quantum island (145) and tunnel junctions (147) are formed between the quantum island (145) and the non-selected region (115). The present invention also includes a single-electron device (200), and a method of manufacturing an integrated circuit (300) that includes a single-electron device (305).

14 Claims, 11 Drawing Sheets

METHOD TO MANUFACTURE SILICON QUANTUM ISLANDS AND SINGLE-ELECTRON DEVICES

TECHNICAL FIELD OF THE INVENTION

The present invention is directed, in general, to the manufacture of a semiconductor device and, more specifically, to a method of manufacturing of a silicon quantum island for a single-electron device.

BACKGROUND OF THE INVENTION

The continuing demand for increasing computational power and memory space is driving the miniaturization of integrated circuits. To sustain progress, miniaturization will soon be driven into the nanometer regime. Unfortunately, conventional devices cannot be scaled down straightforwardly because of problems caused by parasitic resistance, scattering and tunneling, among other things.

Single-electronics offer solutions to some of the problems arising from miniaturization. Single-electronic devices can be made from readily available materials and can use as little as one electron to define a logic state. Unlike conventional devices, single-electron devices show improved characteristics when their feature size is reduced. This follows from the fact that single-electron devices are based on quantum mechanical effects which are more pronounced at smaller dimensions. Single-electron devices also have low power consumption and therefore there are no energy restrictions to exploit the high integration densities that are possible with such devices.

The practical implementation of single-electronic devices has yet to be realized, in part because there is no practical process technology to mass produce nanometer-scale single-electron device structures. Additionally, no process exists for manufacturing single-electronic devices that can be readily combined with present procedures for manufacturing very large scale integrated circuits (VSLI). One reason for the lack of a practical process involves problems in the manufacture of quantum islands and their alignment with other device components.

Quantum islands are a central structural feature of all single-electron devices. Those skilled in the art are familiar with discrete electron tunneling and with other terms used to refer to the quantum island, such as a quantum dot, a grain, a particle or node. The term quantum island as used herein is defined as the structure between contacts, such as a source and drain electrodes. The structure of the quantum island must facilitate the movement of discrete electron tunneling from the source to the quantum island and from the quantum island to the drain.

Conventional methods for forming quantum islands are either impractical or incompatible with existing VSLI process technology. For instance, it is impractical to produce quantum islands in commercial numbers by scanning tunneling microscopy (STM) or atomic force microscopy (AFM). It is also problematic to form quantum islands by using lithographic procedures to select an area of silicon and then performing repeated cycles of etching and oxidation to define the island. The pitch between quantum islands formed in this manner is undesirably large (e.g., center to center distance of greater than 200 nanometers) because of the limits in resolution of existing lithographic technology.

Quantum islands formed by growing germanium, or depositing gold clusters, on silicon substrates suffer from alignment problems. That is, once gold or germanium quantum islands are formed on the substrate, it is very difficult to reproducibly align electrical contacts with the quantum island. This, in turn, makes it difficult to produce single-electron devices with reproducible performance characteristics, and to connect such devices to traditional device components, such as metal oxide semiconductors (MOS) devices.

Accordingly, what is needed in the art is a single-electron device and method of manufacturing thereof that overcomes the above-mentioned problems, and in particular allows for the production of quantum islands that can be easily and reproducibly aligned with contact electrodes.

SUMMARY OF THE INVENTION

To address the above-discussed deficiencies of the prior art, the present invention provides a method of manufacturing a single-electron transistor device. The method comprises forming a thinned region in a silicon substrate, the thinned region offset by a non-selected region. The method also includes forming at least one quantum island from the thinned region by subjecting the thinned region to an annealing process. The non-selected region is aligned with the at least one quantum island and tunnel junctions are formed between the quantum island and the non-selected region.

In another embodiment, the present invention provides a single-electron device. The device includes at least one quantum island composed of silicon on a buried oxide layer of a silicon-on-insulator substrate. The device also comprises source and drain electrodes composed of the silicon. The source and drain electrodes are aligned with the quantum island and the quantum island is located between the source and drain with tunnel junctions between the source and drain.

Yet another embodiment of the present invention is a method of manufacturing an integrated circuit. The method includes forming a single-electron device as described above, and forming a metal-oxide semiconductor (MOS) device in the silicon substrate. The single-electron and MOS devices are interconnected to form an operative integrated circuit.

The foregoing has outlined preferred and alternative features of the present invention so that those of ordinary skill in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description when read with the accompanying FIGURES. It is emphasized that in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention benefits from the serendipitous discovery of conditions for reproducibly forming quantum islands while testing the use of a silicon-on-insulator (SOI) substrate in the fabrication of high speed and low gate voltage MOS devices such as Field Effect Transistors (FETs). A silicon layer present in a commercially available lot of SOI substrate was thinned to a thickness of about 5 to 10 nanometers via sacrificial oxidation. After thinning the silicon layer, and prior to forming raised source/drain structures, via selective epitaxial growth, the surface of the silicon layer was primed to remove surface oxides and other contaminants. Priming comprised an annealing process as further discussed below.

Surprisingly, priming caused the silicon layer to break up into agglomerates of silicon. It was realized that the agglomerates of silicon can advantageously serve as quantum islands in a single-electron device. This result was unexpected because similar priming procedures, performed on thicker silicon layers (e.g., ~20 nanometers or greater), have not resulted in agglomerates of silicon.

While not limiting the scope of the present invention by theory, it is believed that the annealing process in combination with the use of thin silicon, is conducive to weakening or breaking bonds that adhere the silicon layer to the underlying buried oxide layer of the SOI substrate. This, in turn, allows the silicon layer to break up and migrate to form silicon agglomerates on the buried oxide layer. The silicon agglomerates can serve as quantum islands in a single electron device. The inherent high surface tension of silicon contributes to the formation of substantially spherical quantum islands having a thickness that is greater than the thickness of the original silicon layer. Moreover, because it has not previously been recognized that quantum islands can be formed as described herein, the silicon layer thickness and the components of the annealing processes constitute a new set of result-effective variables in the manufacture of single-electron devices.

The method of forming quantum islands according to the present invention advantageously results in the quantum islands being automatically aligned with other portions of the silicon that are not thinned. As further illustrated below, the term aligned as used herein, refers to the footprint of the quantum island being bounded on at least two sides by regions of silicon that were not selected for thinning. This feature ameliorates the above-mentioned contact electrode alignment problems encountered with conventional methods of forming quantum islands.

Figure 1A:
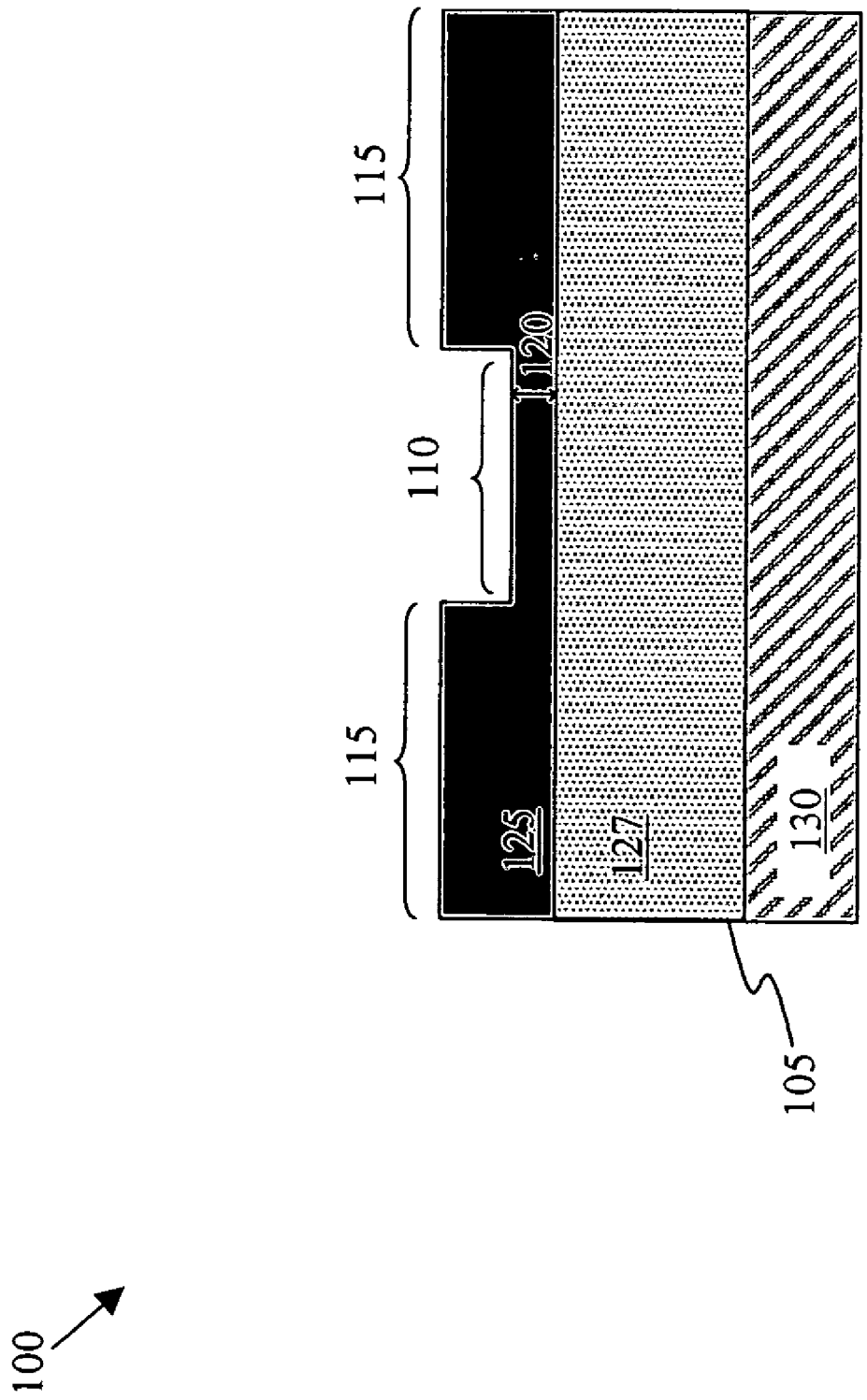
FIGS. 1A to 1G illustrate sectional and plan views of selected steps in an exemplary method for fabricating a single-electron device according to the principles of the present invention.

One embodiment of the present invention is a method for manufacturing a single-electron device. FIGS. 1A through 1G illustrate cross sectional, and in some cases, plan views, at selected steps in the manufacture of a single-electron device 100 according to the principles of the present invention. Turning first to FIG. 1A, illustrated is a cross-sectional view of a silicon substrate 105 after forming a thinned region 110 in the silicon substrate, the thinned region offset by a non-selected region 115. In some advantageous embodiments, the thinned region 110 has a thickness 120 of about 20 nanometers or less. For instance, in some cases, the thinned region 110 has a thickness 120 of between about 2 and about 20 nanometers.

Any conventional process can be used to form the thinned region, although in some preferred embodiments, the thinned region 110 is formed by the sacrificial oxidation of a crystalline silicon layer 125 of a silicon on insulator (SOI) substrate 105, having a buried oxide layer 127 and bulk silicon layer 130. Sacrificial oxidation refers to a widely known process where an oxide layer is successively grown and removed from the surface of a silicon layer 110 selected for thinning. Any conventional sacrificial oxidation process can be used to thin the silicon layer 110. As an example, sacrificial oxidation can comprise a thermal oxidation of silicon at about 900 to about 1100° C., and the subsequent removal of the resulting silicon oxide (e.g., $SiO_2$) formed by an acid etch, such as an aqueous hydrofluoric acid solution. Of course, one skilled in the art would understand that other procedures, such as plasma etching, could be used to thin the silicon layer 110.

Figure 1B:
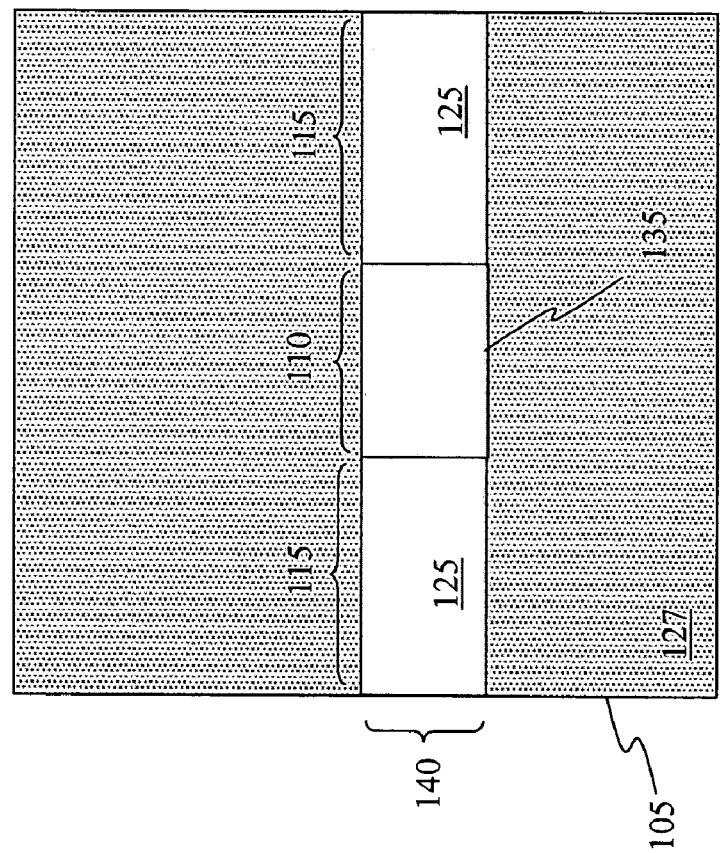

As further illustrated in the plan view of the partially completed device 100, shown in FIG. 1B, the thinned region has a footprint 135 that defines where the quantum island is to be formed. In certain preferred embodiments, the thinned region 110 is part of a conductive line 140 formed from the silicon substrate 105. The conductive line 140 can be formed from a portion of the silicon substrate 105, such as the crystalline silicon layer 125, using conventional patterning and lithographic procedures. Of course, if desired, the selected thinned region 110 or non-selected region 115, comprising the conductive line 140, can be doped with conventional dopants, such as boron or arsenic, to increase their conductivity.

Figure 1C:
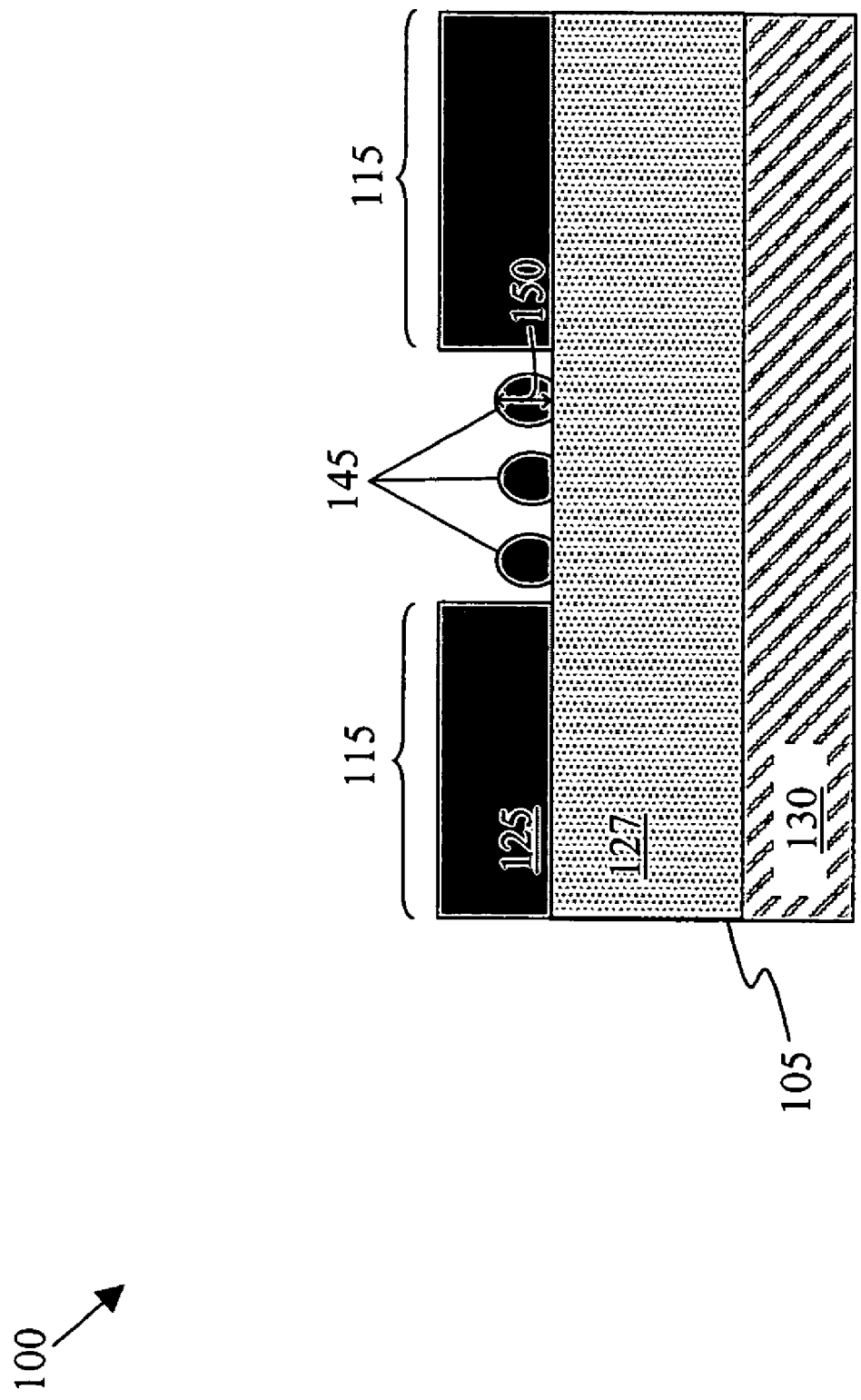
Figure 1D:
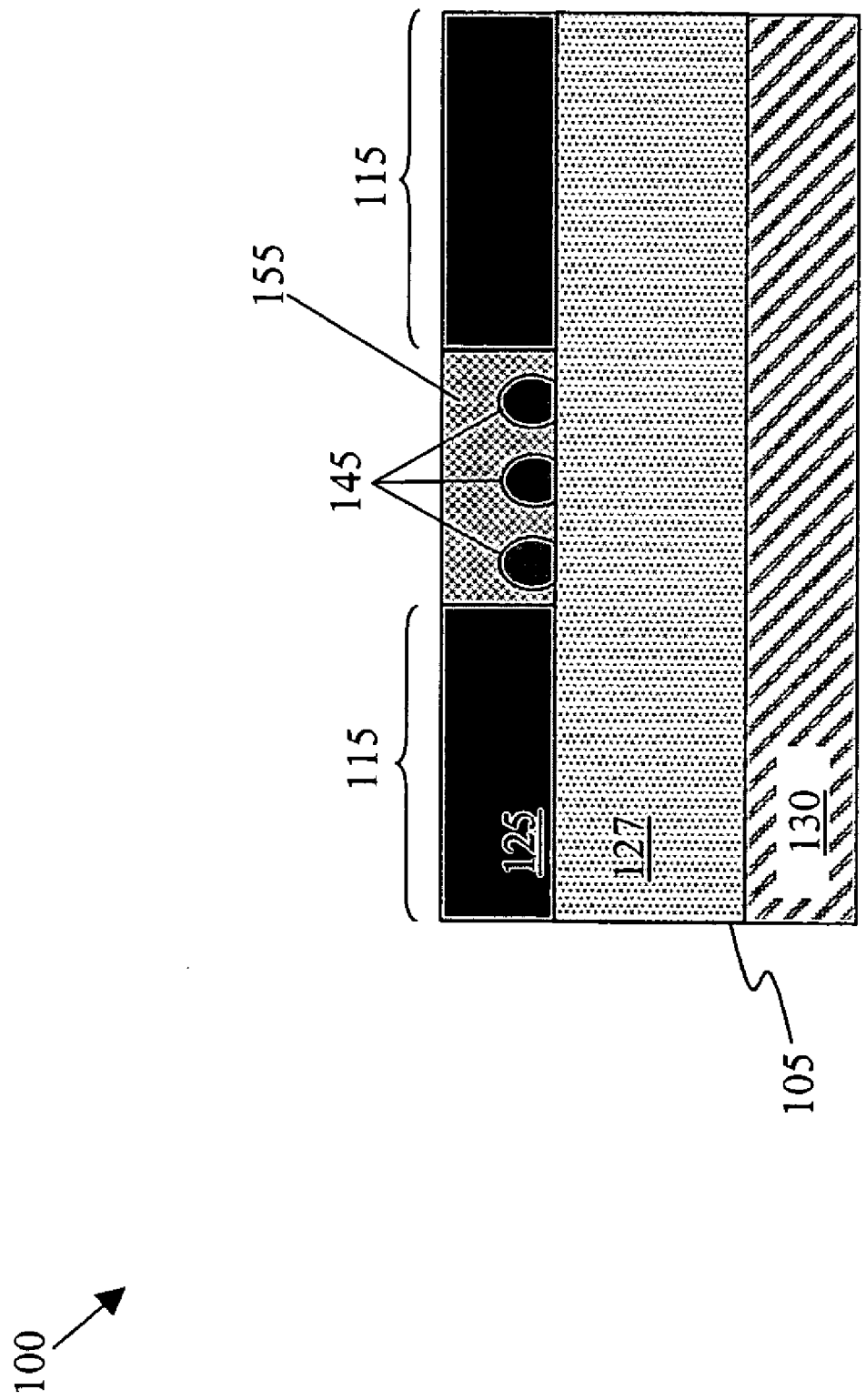

With continuing reference to FIG. 1A, FIG. 1C illustrates a cross-sectional view of the partially completed device 100 after forming at least one quantum island 145 by subjecting the thinned region 110, to an annealing process. In other instances, however, a plurality of quantum islands 145 can be formed from the thinned region 110. The annealing process is controlled such that the quantum island 145 is formed between and aligned with the non-selected region 115. As a result, tunnel junctions 147 are formed between the quantum island 145 and the non-selected region 115.

The thickness of the quantum island 120 depends on the initial thickness of the thinned region 110 and the extent to which the silicon agglomerates. In certain preferred embodiments, the thickness 150 of the quantum island 145 is greater than the thickness 120 of the thinned region 110. For example, in some instances, the thickness 150 of the quantum island 145 is at least about 20 percent greater than the thickness 120 of the thinned region 110. In some preferred embodiments, the quantum island 145 is substantially spherical.

The annealing process preferably includes a temperature of between about 600° C. and about 1000° C. In some embodiments, the annealing process is performed for between about 1 and about 10 minutes. The annealing process also preferably includes exposing the thinned region 110 to $H_2$ gas at a pressure of less than about 100 Torr. In some situations, the annealing process includes exposing the thinned region 110 to pure $H_2$ gas at a pressure of about 20 Torr at a temperature of about 950° C. for about 2 minutes;

In other situations, the annealing process includes exposing the thinned region 110 to pure $H_2$ gas at a pressure of about $3 \times 10^{-5}$ Torr at a temperature of about 700 to about 850° C. for about 2 minutes. In some cases, it is desirable to adjust the concentration of $H_2$ gas by further including an inert gas, such as argon or helium. Adjusting the concentration of $H_2$ gas in this fashion moderates the extent of agglomeration of silicon thereby allowing one to further control this process. In some embodiments suitable ratios of $H_2$:inert gas can range from 1:1 to about 1:50.

In some instances, it is desirable to modify the performance characteristics of the single-electron device 100 by altering the energy barrier for electron tunneling through the tunnel junctions 150. As illustrated in the cross-section view presented in FIG. 1D, this can be done by depositing an insulating material 155 around the quantum island 145. Suitable insulating material 155 includes silicon oxide or a high-k dielectric material such as $HfO_2$ or HfSiON. The insulating material can also advantageously provide structural support and insulation from subsequently formed device layers, such as conductive layers, deposited over the quantum island 145. In other instances, however, the insulating material 155 can simply be air.

Figure 1E:
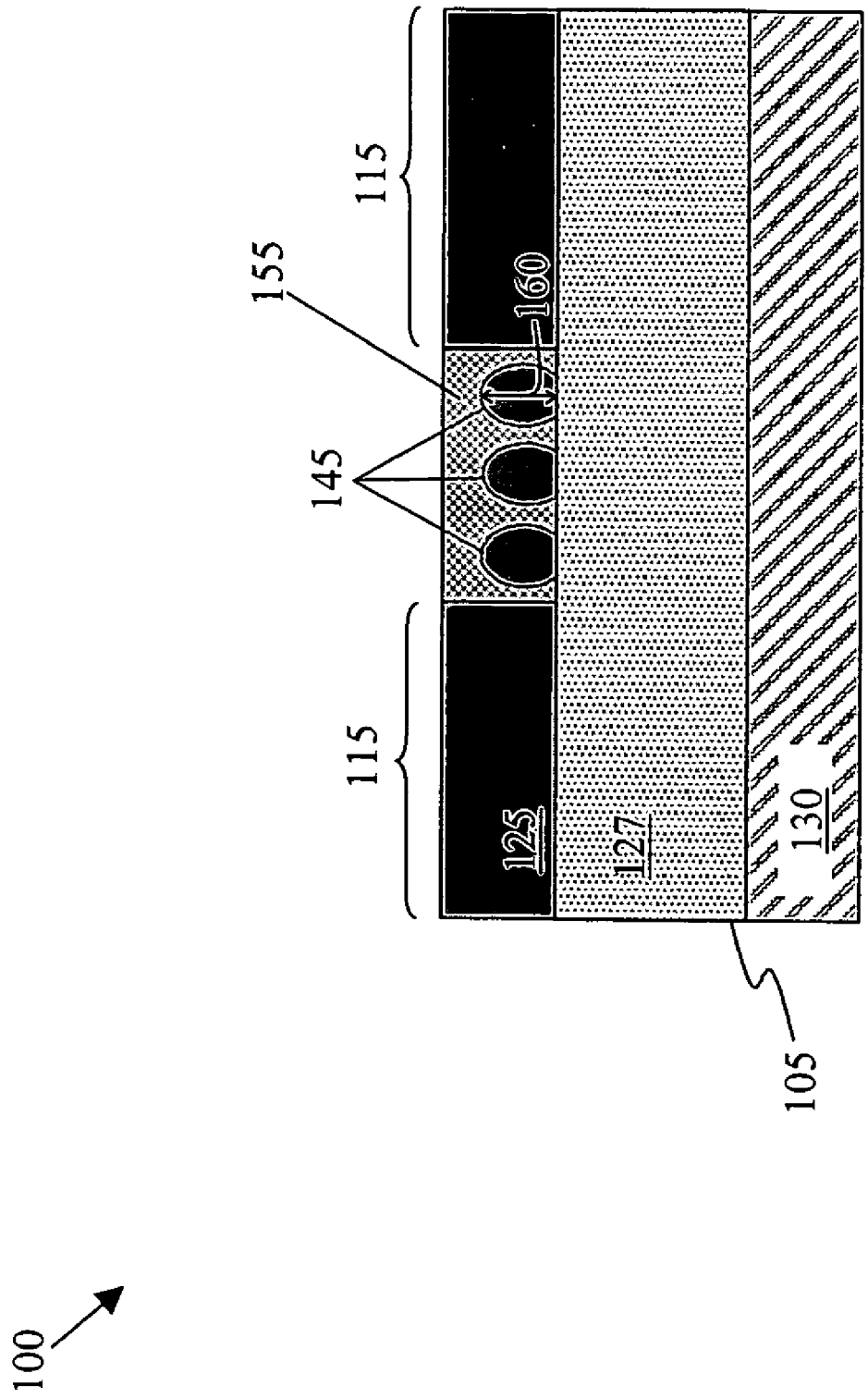

Of course, the performance characteristics of the single-electron device 100 can also be adjusted by changing the size of the quantum island 145 once it is formed by the above-described annealing process. For instance, enlarging the quantum island 145 can advantageously reduce the size of the tunnel junctions 147, thereby facilitating electron tunneling. With continuing reference to FIG. 1C, FIG. 1E illustrates the device 100 after enlarging the quantum island 145 by a selective epitaxial growth process. In some embodiments, for instance, the adjusted thickness 160 of the quantum island is between about 10 and about 20 percent larger than the original thickness 150 of the quantum island 145. Any number of conventional selective epitaxial growth processes can be used to enlarge the quantum island 145. As an example, selective epitaxial growth can be achieved via commercially available tools using chemistries such as $Si_2H_6/Cl2$.

Figure 1F:
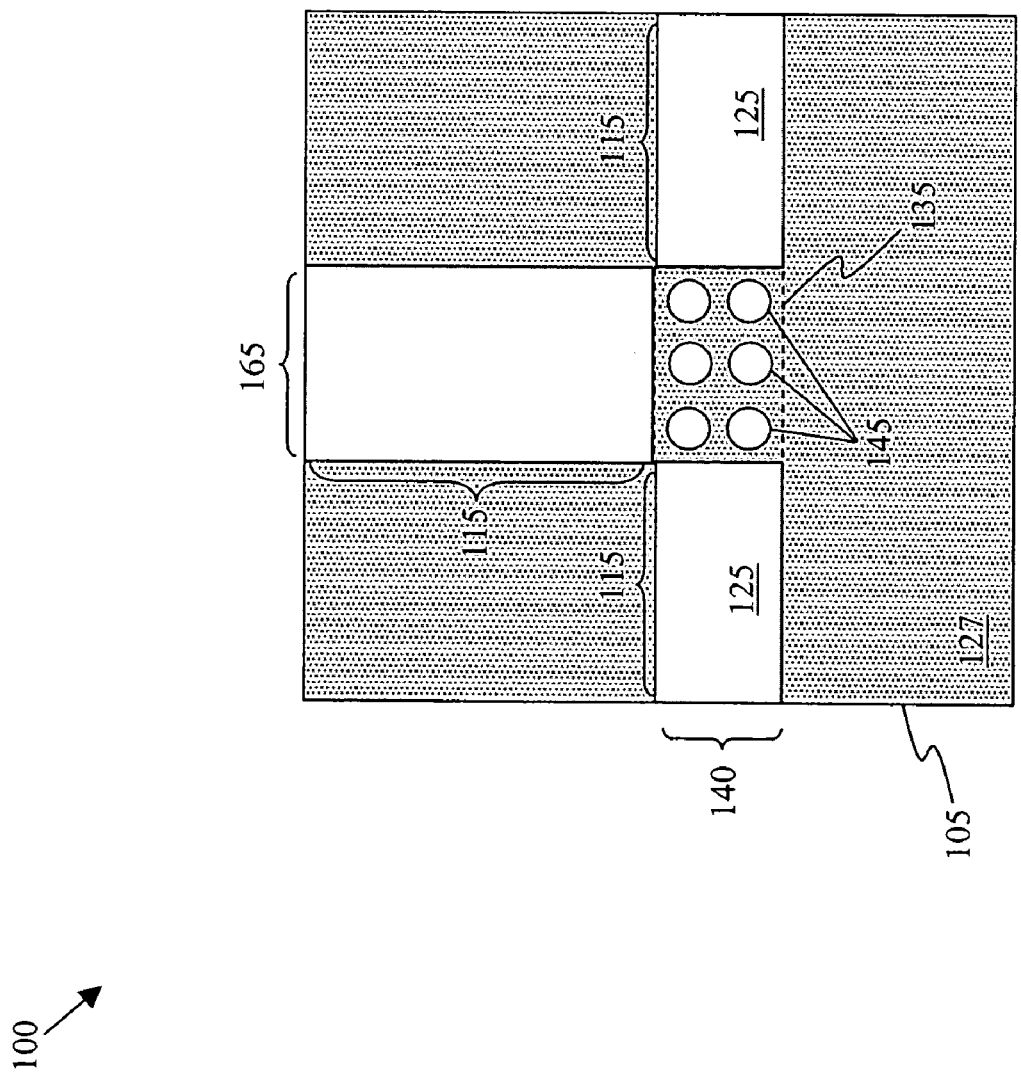

As the plan view in FIG. 1F illustrates, in some cases it is advantageous to form a plurality of conductive lines 140, 165 and for the footprint of the quantum island 135 to be defined by an intersection of the conductive lines 140, 165. In such embodiments, at least one of the conductive line 165 is a gate electrode while another conductive line 140 serves as a source and drain electrode of a single-electron transistor device 100.

Figure 1G:
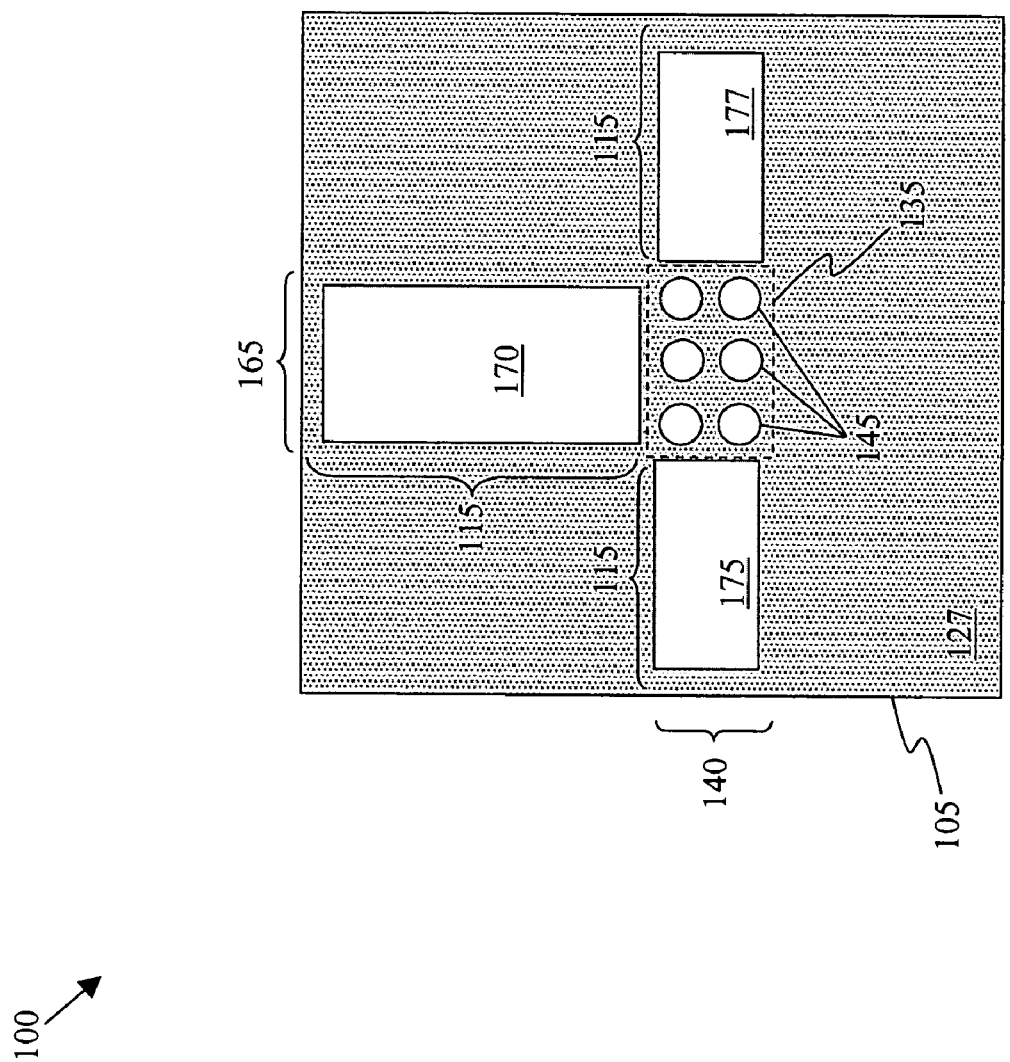

As further illustrated in FIG. 1G, if desired, the non-selected region 115 of the conductive lines 140, 165 can be further patterned before or after forming the quantum island 145 to form a gate electrode structure 170 or electrical contacts, such as source and drain electrodes, 175, 177. Forming a side gate electrode structure, such as shown in FIG. 1G, can be advantageous because the gate electrode 170 and source and drain electrodes 175, 177 are all formed in a single lithographic step. Moreover, because these structures 170, 175, 177 bound at least two sides of the footprint of the quantum island 135, they are automatically aligned with the quantum island 145. Alignment is automatic because the quantum islands 145 and these structures 170, 175, 177 are formed from the same substrate 105, as explained above. Of course, other gate structures, such as dual-gate and tri-gate structures, also fall within the scope of the present invention.

In some embodiments, for example, where a device with a smaller area is desired, the gate electrode 170 can be formed above or below the quantum island 145. While this particular embodiment is not shown, it is readily apparent to those skilled in the art how to fabricate the device 100 using conventional procedures and the method disclosed herein. In some instances, an overlying or underlying gate can advantageously provide more uniform control of tunneling through the tunnel junctions. This can be the case when a two-dimensional array of quantum islands is formed, because the field generated by the overlying or underlying gate is more uniformly distributed around the quantum islands than a side gate. Alternatively, in embodiments where there is a single quantum island or a one-dimensional column of quantum islands, a side gate electrode 170 can provide a uniform field around the quantum island or islands 145.

Additionally, in some embodiments, the gate electrode 170 is moveable under a voltage bias. As explained in U.S. patent application Ser. No. 10/448,673, filed May 30, 2003, and incorporated by reference herein in its totality, the Coulomb oscillation frequency of the drain current of the single-electron device 100 can be modulated by changing the gate capacitance of the device through movement of the gate 170. Changing the Coulomb oscillation frequency, in turn, allows the single-electron device 100 to store and transmit logic states.

Another embodiment of the present invention is a single-electron device. Any of the above-described methods can be used to manufacture a single-electron device 200, such as the exemplary transistor device shown in the perspective drawing of FIG. 2. One skilled in the art would understand that similar procedures could be used to form a variety of single-electron devices 200 that also fall within the scope of the present invention. As an example, single-electron diode devices are also within the scope of the present invention.

Figure 2:
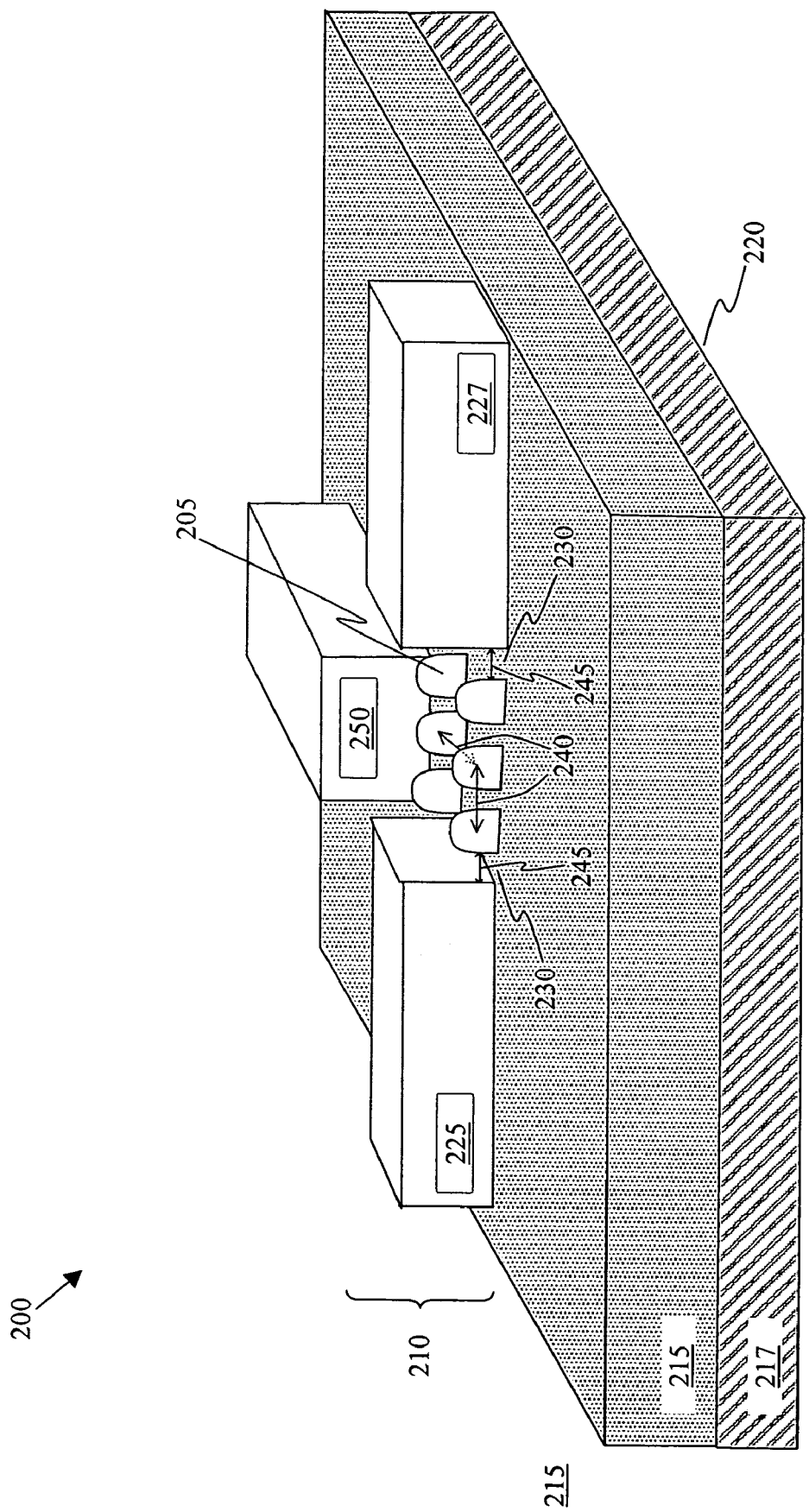
FIG. 2 illustrates a perspective view of an exemplary single-electron device of the present invention.

As illustrated in FIG. 2, the single-electron device 200 includes at least one quantum island 205 composed of silicon 210 on a buried oxide layer 215 on a bulk silicon layer 217 of a silicon-on-insulator substrate 220. The device 200 also includes source and drain electrodes 225, 227 also composed of the silicon 210, and aligned with the quantum island 205. The quantum island 205 is located between the source and drain electrodes 225, 227, with tunnel junctions 230 between the source and drain electrodes 225, 227.

As further illustrated in FIG. 2, in preferred embodiments of the device 200, the quantum island 205 has a diameter ranging from about 10 to about 100 nanometers. When there is a plurality of quantum islands 205, the average diameter is in the above-cited range. In other preferred embodiments, the plurality of quantum islands 205 have an average pitch 240 of about 200 nanometers or less, and more preferably less than about 100 nanometers, and even more preferably, from about 5 to 10 nanometers. As a consequence of the above-described annealing process, in some advantageous embodiments, the plurality of quantum islands 205 are uniformly spaced in a two-dimensional array or one-dimensional column. In still other preferred embodiments, the tunnel junctions 230 include a gap 245 between the source and drain electrodes 225, 227, and the quantum island 205, the gap 245 ranging from about 1 to about 1000 nanometers.

As also illustrated in FIG. 2, the single-electron device 200 can further include a gate electrode 250. The gate electrode 250 is configured to modulate a tunneling barrier of the tunnel junctions 230 when a voltage is applied to the gate electrode 250. In some preferred embodiments, the gate electrode 250 is also composed of the silicon 210 used to form the quantum island 205 and source and drain electrodes 225, 227.

In some embodiments, it is advantageous for a number of the component parts of the single-electron transistor device to be in substantially the same plane. For example, it is advantageous for the quantum island 205, source and drain electrodes 225, 227 and gate electrode 250 to all be located in substantially a same plane. In alternative embodiments, as noted above, the quantum island 205 and source and drain electrode 225, 227 are located in substantially a same plane and gate electrode 250 is located substantially out of the plane. In such instances, the gate electrode 250 can comprise silicon 210, or other electrically conductive material, such as aluminum.

Figure 3A:
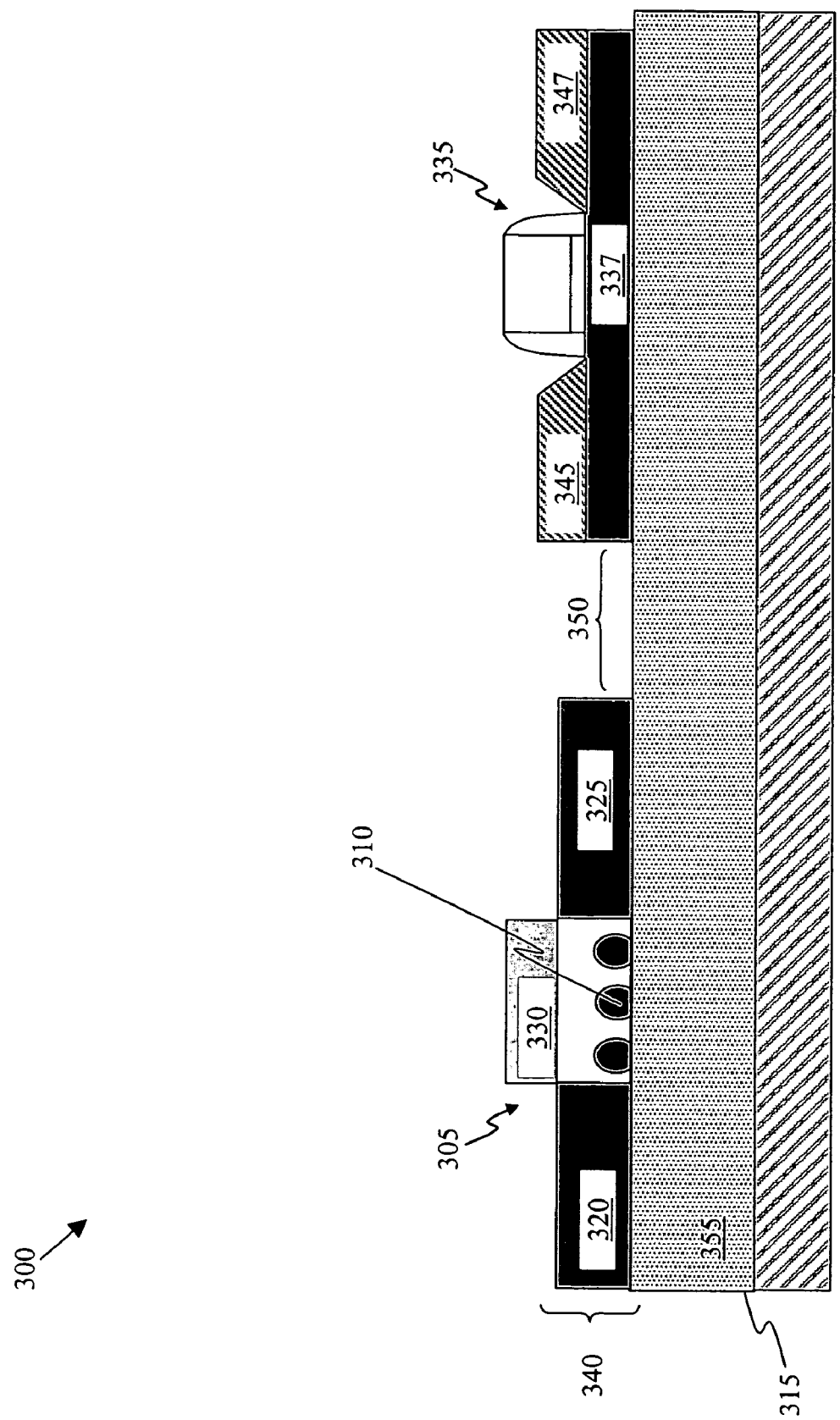
FIGS. 3A and 3B present cross-sectional views of selected steps in an exemplary method for manufacturing an integrated circuit of the present invention.
Figure 3B:
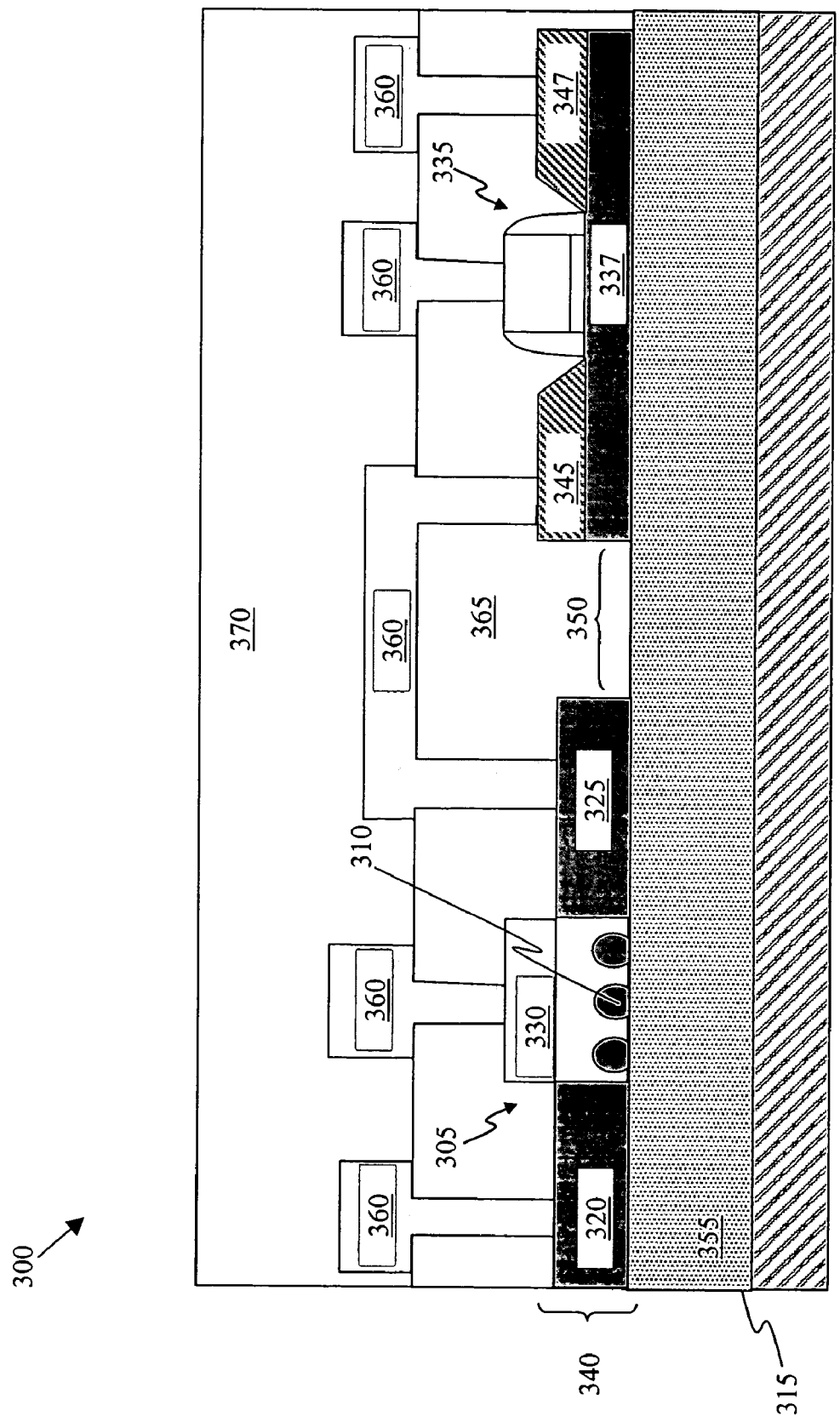

Yet another embodiment of the present invention is a method of manufacturing an integrated circuit. FIGS. 3A and 3B present cross-sectional views of selected steps in an exemplary method for manufacturing an integrated circuit 300 according to the principles of the present invention.

Turning first to FIG. 3A, illustrated is a selected portion of the partial completed integrated circuit 300 after forming a single-electron device 305. The single-electron device 305 can be manufactured by any of the previously discussed embodiments. For instance, as illustrated in FIG. 3A, the single-electron device 305 can be a transistor that includes at least one quantum island 310 formed by subjecting a thinned region of a silicon substrate 315 to an annealing process as described above. As discussed above and illustrated in FIGS. 1A–1G, non-selected regions of the silicon substrate 315 can be further patterned to formed source and drain electrodes 320, 325 that are aligned with the quantum island or islands 310. As further illustrated in FIG. 3A, the single-electron device 305 can further include a gate electrode 330 formed adjacent to the quantum island 310. For example, as illustrated, the gate electrode 330 can be formed over the quantum island 310, using conventional procedures to deposit and pattern a metal layer.

FIG. 3A also illustrates the partially completed integrated circuit after formed a MOS device 335 in the silicon substrate 315. In some preferred embodiments, the MOS device 335 is a metal-oxide semiconductor field-effect transistor (MOSFET) formed in the crystalline silicon layer 340 of a SOI substrate 315. In some instances, it is desirable for a channel 337 of the MOS device to comprise a portion of crystalline silicon layer 340. In some preferred embodiments, the MOS device includes one or more transistors, such as PMOS and NMOS transistors, to form a CMOS device.

Some advantageous embodiments of the MOSFET have raised source and drain electrodes 345, 347, formed via selective epitaxial growth similar to that described above. As well known by those skilled in the art, raised source and drain electrodes can advantageously reduce electrical resistance in the source drain regions and thereby improve device 335 performance. As further illustrated in FIG. 3A, in some cases device isolation can be achieved by removing portions of the crystalline silicon layer 340 to form an opening 350 and thereby expose portions of the buried oxide layer 355 of an SOI substrate 315.

Turning now to FIG. 3B, shown is the partially completed integrated circuit 300 after interconnecting the MOS device 335 to the single-electron device 305 to form an operative integrated circuit 300. As illustrated in FIG. 3B, interconnect metals lines 360 in or on one or more dielectric layers 365, 370, located over single-electron 305 and MOS devices 335 can interconnect the two devices 305, 335 to each other, or other components in the integrated circuit 300. In some preferred embodiments, for instance, the MOSFET 335 is connected to the single-electron device 305 so as to amplify a drain current from the single-electron device 305. One skilled in the art would understand how the single-electron 305 and MOS devices 335 could be configured to provide memory or logic device components in the integrated circuit 300.

Having described the present invention, it is considered that the same will become even more apparent by reference to the following examples. It should be appreciated that the examples are presented solely for the purpose of illustration and should not be construed as limiting the invention. For instance, although the experiments described below may be carried out in laboratory setting, one of ordinary skill in the art could adjust specific numbers, dimensions and quantities up to appropriate values for a full scale plant.

EXAMPLE

Selected data to illustrating the fabrication and evaluation of a test device are presented to demonstrate various methods and beneficial features of the invention.

A commercial sample of SOI substrate (standard UNIBOND™ from Silicon On Insulator Technologies, Bernin, France), having crystalline silicon layer average thickness of ~500 Angstrom and buried oxide layer average thickness of ~4000 Angstrom thick layer, was used as the starting substrate. A selected portion of the crystalline silicon layer was isolated and thinned to a thickness of 50 to 100 Angstroms via sacrificial oxidation. This was achieved by performing a blanket sacrificial oxidation of the silicon to reduce its thickness, standard processing to form the gate and sidewalls, and then followed by selective epitaxial growth (SEG) to define the source drain electrodes. As part of the SEG, SOI wafers were subjected to a high-temperature pre-SEG clean process that caused the thinned silicon to agglomerate into the spheres. The pre-SEG clean comprised a ~950° C. anneal in a pure $H_2$ atmosphere at ~20 Torr for ~2 minutes.

Figure 4:
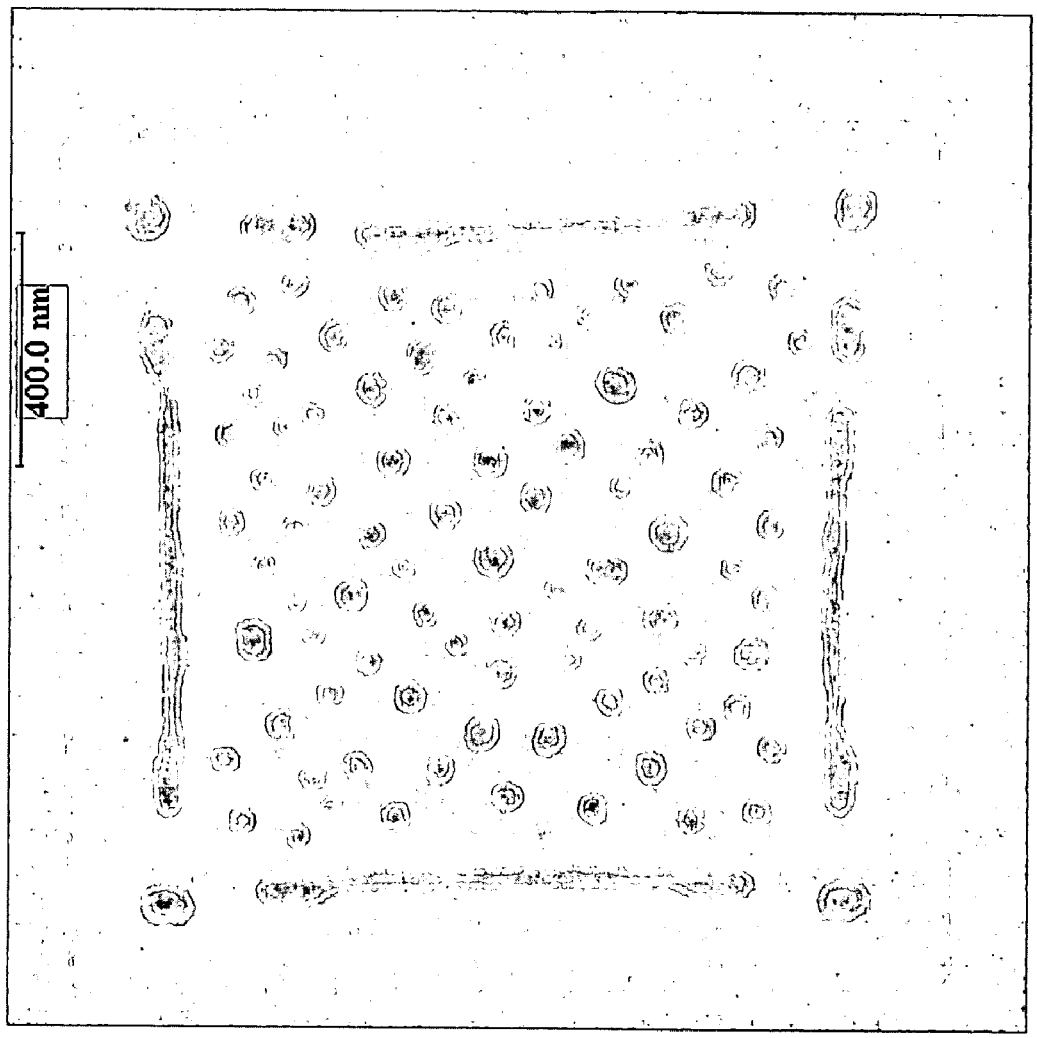
FIG. 4 presents an exemplary scanning electron microscopy image obtained for a test device manufactured according to the principles of the present invention.

FIG. 4 presents an exemplary scanning electron microscopy image obtained for one test device manufactured as described above. As shown in the figure, the thinned silicon layer breaks up and agglomerates to form islands of silicon on the buried oxide layer. As further illustrated in FIG. 4, the islands of silicon formed a regular geometric pattern and having diameters ranging from about 30 to 80 nanometers and pitch of about 100 nanometers.

Although the present invention has been described in detail, one of ordinary skill in the art should understand that they can make various changes, substitutions and alterations herein without departing from the scope of the invention.

What is claimed is:

1. A method of manufacturing a single-electron device, including:
    forming a silicon layer having a thinned region on a silicon substrate, said thinned region offset by a thicker non-selected region; and
    forming at least one quantum island from said thinned region by subjecting said thinned region to an annealing process wherein said non-selected region is aligned with said at least one quantum island and tunnel junctions are formed between said quantum island and said non-selected region.

2. The method as recited in claim 1, wherein said thinned region has a thickness of about 20 nanometers or less.

3. The method as recited in claim 1, wherein said thinned region is formed by sacrificial oxidation.

4. The method as recited in claim 1, wherein forming said at least one quantum island includes forming a plurality of quantum islands from said thinned region.

5. The method as recited in claim 1, wherein said annealing process comprises a temperature of between about 600° C. and 1000° C.

6. The method as recited in claim 1, wherein said annealing process includes exposing said thinned region to $H_2$ gas at a pressure of less than about 100 Torr.

7. The method as recited in claim 1, wherein forming said at least one quantum island includes depositing an insulating material around said at least one quantum island.

8. The method as recited in claim 1, further including enlarging said at least one quantum island by a selective epitaxial growth process.

9. The method as recited in claim 1, wherein said thinned region is part of a conductive line formed from said silicon layer.

10. The method as recited in claim 9, wherein said non-selected region is a second part of said conductive line and comprises source and drain electrodes.

11. The method as recited in claim 9, wherein said conductive line comprise a plurality of conductive lines and said thinned region is defined by an intersection of two or more of said plurality of conductive lines.

12. The method as recited in claim 9, wherein said conductive line comprise a plurality of conductive lines and at least one of said plurality of conductive lines serve as a gate electrode.

13. Method of manufacturing an integrated circuit, including:

forming a single-electron device comprising:

forming a silicon layer having a thinned region on a silicon substrate, said thinned region offset by a thicker non-selected region; and forming at least one quantum island from said thinned region by subjecting said thinned region to an annealing process wherein said non-selected region is aligned with said at least one quantum island and tunnel junctions are formed between said quantum island and said non-selected region;

forming a MOS device in said silicon substrate; and interconnecting said MOS device to said single-electron device to form an operative integrated circuit.

14. The method as recited in claim 13, wherein forming said single-electron device includes forming a single-electron transistor by forming a gate located adjacent said quantum island.

* * * * *